(12) United States Patent
Ito

(10) Patent No.: US 7,190,035 B2
(45) Date of Patent: Mar. 13, 2007

(54) SEMICONDUCTOR DEVICE HAVING ELEVATED SOURCE/DRAIN ON SOURCE REGION AND DRAIN REGION

(75) Inventor: Hitoshi Ito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 157 days.

(21) Appl. No.: 10/802,758

(22) Filed: Mar. 18, 2004

(65) Prior Publication Data

US 2005/0127468 A1 Jun. 16, 2005

(30) Foreign Application Priority Data

Dec. 12, 2003 (JP) ............................ 2003-415319

(51) Int. Cl.
*H01L 29/76* (2006.01)
*H01L 29/94* (2006.01)

(52) U.S. Cl. ..................... 257/374; 257/377; 257/385

(58) Field of Classification Search ................ 257/374, 257/365, 369, 506, 510, 647, 377, 381, 385
See application file for complete search history.

(56) References Cited

U.S. PATENT DOCUMENTS 6,137,149 A    10/2000   Kodama 6,326,281 B1   12/2001   Violette et al.
6,545,317 B2 *  4/2003   Hokazono et al. .......... 257/336

FOREIGN PATENT DOCUMENTS

| JP | 2000-049348 |   | 2/2000  |
|----|-------------|---|---------|
| JP | 2000-260952 | * | 9/2000  |
| JP | 2001-44138  |   | 2/2001  |
| JP | 2002-368227 |   | 12/2002 |

OTHER PUBLICATIONS

Office Action issued by the Japanese Patent Office, dated Nov. 15, 2005, for Japanese Patent Application No. 2003-415319.

* cited by examiner

*Primary Examiner*—Theresa T. Doan
(74) *Attorney, Agent, or Firm*—Finnegan, Henderson, Farabow, Garrett & Dunner, L.L.P.

(57) ABSTRACT

A semiconductor device disclosed herein comprises: an element isolation insulator which is formed on the surface side of a semiconductor substrate to provide electrical insulation from other elements, a height of a surface of the element isolation insulator being equal to or lower than that of a surface of the semiconductor substrate; a stopper which is formed of a material different from that of the element isolation insulator and which is at a predetermined distance from the semiconductor substrate so as to protrude from the surface of the element isolation insulator; and an elevated source/drain which is formed on a source region and a drain region so as to be elevated from the surface of the semiconductor substrate.

12 Claims, 9 Drawing Sheets

"Prior Art"

"Prior Art"

SEMICONDUCTOR DEVICE HAVING ELEVATED SOURCE/DRAIN ON SOURCE REGION AND DRAIN REGION

CROSS REFERENCE TO RELATED APPLICATION

This application claims benefit of priority under 35 U.S.C. § 119 to Japanese Patent Application No. 2003-415319, filed on Dec. 12, 2003, the entire contents of which are incorporated by reference herein.

BACKGROUND OF THE INVENTION

1. Field of the Invention

The present invention relates to a semiconductor device and a method for manufacturing the same, and particularly relates to a semiconductor device having a structure in which a source region and a drain region are elevated from the surface of a silicon substrate, that is, having elevated source/drain or raised source/drain, which is used in an SoC (System on Chip) and the like, and a method for manufacturing the same.

2. Related Background Art

With the miniaturization and speeding up of a semiconductor element, salicide (Self Aligned Silicide) technology for forming a high melting point metal silicide (Co silicide, Ni silicide, or the like) film on source and-drain diffusion regions in a self-aligned manner is widely used for an element structure especially for the SoC and the like. The depths of the source and drain diffusion regions are scaled with the miniaturization and speeding up of the semiconductor element, which causes the need for forming the depths of the source and drain diffusion regions more shallowly. The salicide technology utilizes a phenomenon in which a high melting point metal film shows a silicide formation reaction while consuming a silicon semiconductor substrate, which causes a problem that junction leakage occurs by a junction being made shallower due to variations in consumed silicon film thickness in the semiconductor substrate, diffusion of high melting point metal atoms into the semiconductor substrate, and so on. Because of such a problem, scaling to make the junction depth shallower has been difficult in the existing salicide technology.

To solve this problem, it is proposed to form epitaxial silicon in a source region and a drain region at the surface of the semiconductor substrate. Namely, an epitaxial silicon film is formed on the source region and the drain region, then impurity ions are implanted into the surface of the semiconductor substrate, and subsequently a high melting point metal film is formed and silicided, so that the formation of salicide and the formation of a junction in a shallow region from the surface of the semiconductor substrate are compatible.

The aforementioned technology utilizing a structure in which the source region and the drain region are elevated from the original surface of the semiconductor substrate is called elevated source/drain technology or raised source/drain technology.

FIG. 1 shows a MOS transistor using related elevated source/drain technology. A silicon semiconductor substrate 12 includes an element isolation insulating film 10A, and a gate electrode 14 having an SiN/polysilicon stacked structure is formed on the silicon semiconductor substrate 12 with a gate oxide film 13 therebetween. A gate sidewall SiO$_2$ 16 and a gate sidewall SiN 18 are formed at a sidewall of the gate electrode 14. A diffusion region 19 is formed in each of a source region and a drain region by ion implantation and annealing.

Then, as shown in FIG. 2, an epitaxial silicon film 20 made of single-crystal silicon is formed on the source diffusion region 19 and the drain diffusion region 19 by an epitaxial growth method. At this time, a facet sometimes appears at the lower end of the gate sidewall, and as an example of measures therefor, a method disclosed in Japanese Patent Laid-open No. 2000-49348 (Patent Document 1) can prevent the facet from appearing.

However, as shown in FIG. 2, even if the aforementioned method is employed, a facet 22 is formed at an interface of the epitaxial silicon film 20 with the element isolation insulating film 10, which sometimes causes a problem such as a short circuit or junction leakage. For this problem, a method of solving the problem by the installation of a stopper film, for example, by a method disclosed in Japanese Patent Laid-open No. 2000-260952 (Patent Document 2) is proposed. However, the surface of the element isolation insulating film 10 is generally higher or lower than the surface of the semiconductor substrate 12, and hence, when the surface of the element isolation insulating film 10 is higher than the surface of the semiconductor substrate 12 as shown in FIG. 2, there arises a problem that the facet 22 such as shown in FIG. 2 is formed. On the other hand, when the surface of the element isolation insulating film 10 is lower than the surface of the semiconductor substrate 12, there arises a problem that the facet 22 such as shown in FIG. 3 is formed. Additionally, when the stopper film is SiO$_2$, there arises a problem that a similar facet is formed.

Moreover, in Japanese Patent Laid-open No. 2002-368227 (Patent Document 3) and U.S. Pat. No. 6,326,281 (Patent Document 4), a method of directly forming SiN in an element isolation trench is proposed, but this method has a problem that the element isolation withstand voltage deteriorates due to charge injection into an SiN film or strong stress possessed by the SiN film.

As can be seen from the above description, the related arts have a problem that a facet appears in the epitaxial silicon film 20 formed on the source region and the drain region.

SUMMARY OF THE INVENTION

In order to accomplish the aforementioned and other objects, according to one aspect of the present invention, a semiconductor device, comprises:

a semiconductor substrate;

a source region which is formed in a surface side of the semiconductor substrate;

a drain region which is formed in the surface side of the semiconductor substrate which is apart from the source region;

a gate electrode which is formed on the semiconductor substrate via an gate insulating film and which is between the source region and the drain region;

an element isolation insulator which is formed on the surface side of the semiconductor substrate to provide electrical insulation from other elements, a height of a surface of the element isolation insulator being equal to or lower than that of a surface of the semiconductor substrate;

a stopper which is formed of a material different from that of the element isolation insulator and which is at a predetermined distance from the semiconductor substrate so as to protrude from the surface of the element isolation insulator; and an elevated source/drain which is formed on the source region and the drain region so as to be elevated from the surface of the semiconductor substrate.

According to another aspect of the present invention, a method for manufacturing a semiconductor device, comprises:

forming an element isolation insulator on a surface side of a semiconductor substrate at a height equal to or lower than a surface of the semiconductor substrate;

forming a stopper at a predetermined distance from the semiconductor substrate so as to protrude from a surface of the element isolation insulator, wherein a material of the stopper is different from that of the element isolation insulator; and forming an elevated source/drain on a source region and a drain region of the semiconductor substrate, wherein the elevated source/drain is elevated from the surface of the semiconductor substrate.

DETAILED DESCRIPTION OF THE EMBODIMENTS

FIRST EMBODIMENT

In the first embodiment, in a semiconductor device in which an epitaxial silicon film is formed on a source region and a drain region by silicon selective epitaxial growth, the height of the surface of an element isolation insulating film adjoining each of the source region and the drain region is made equal to or lower than that of the surface of a semiconductor substrate forming the source region and the drain region, and a stopper (a step structure) made of a material different from that of the element isolation insulating film is formed on part of the element isolation insulating film. Particularly, in this embodiment, the element isolation insulating film is formed of a material including $SiO_2$ as its major constituent, and a material different from that of the element isolation insulating film is formed of a material including SiN as its major constituent. A more detailed explanation will be given below.

Figure 1:
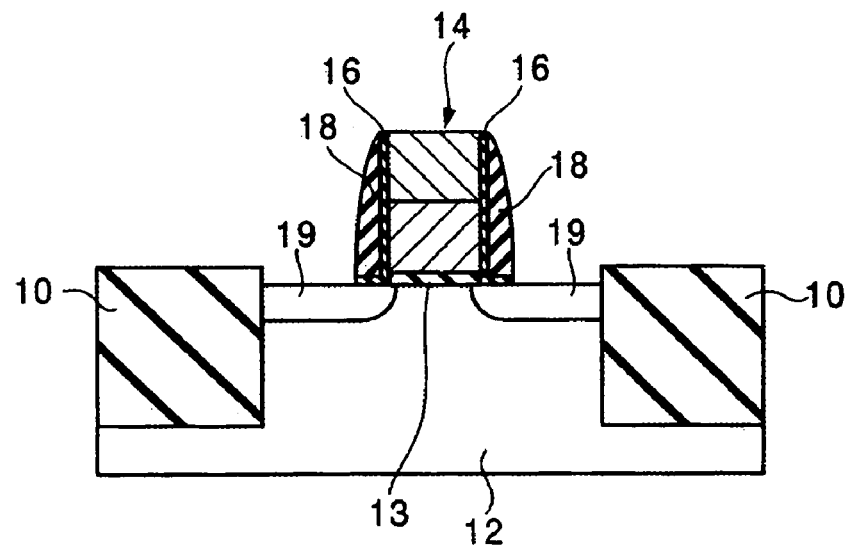
FIG. 1 is a sectional view for explaining a manufacturing process of a semiconductor device composing a related MOS transistor.
Figure 2:
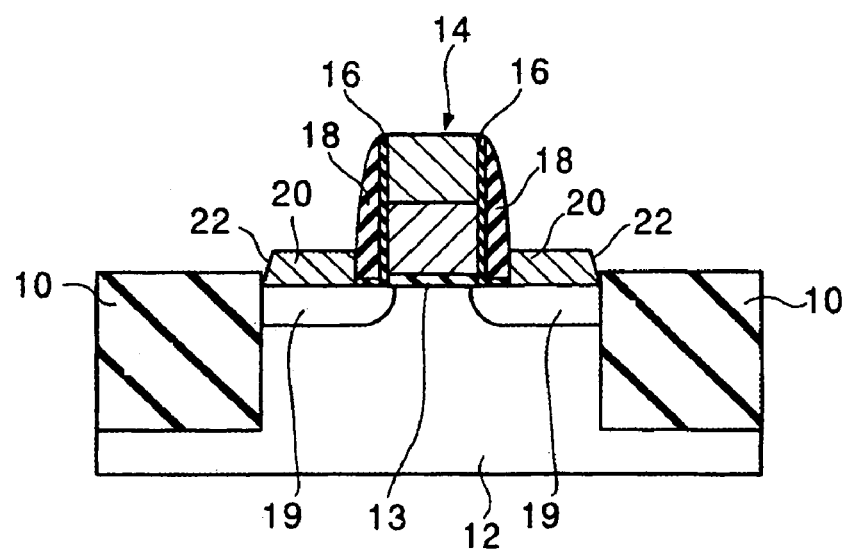
FIG. 2 is a sectional view for explaining the semiconductor device composing the related MOS transistor (when the surface of an element isolation insulating film is higher than the surface of a semiconductor substrate)
Figure 3:
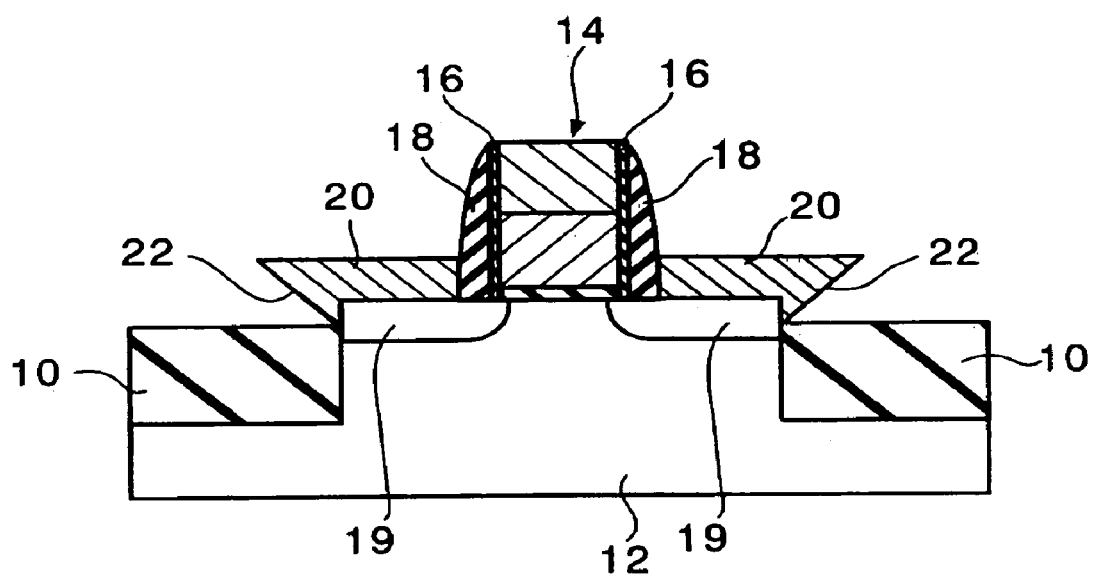
FIG. 3 is a sectional view for explaining the semiconductor device composing the related MOS transistor (when the surface of the element isolation insulating film is lower than the surface of the semiconductor substrate)
Figure 4:
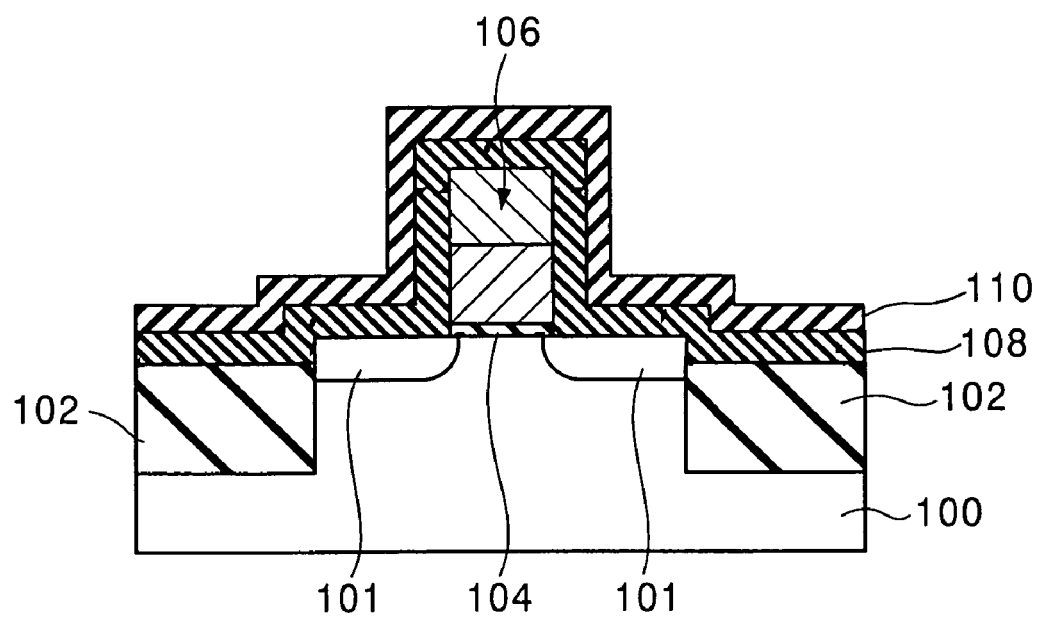
FIG. 4 is a sectional view for explaining a manufacturing process of a semiconductor device composing a MOS transistor according to a first embodiment.

As shown in FIG. 4, in the semiconductor device according to this embodiment, an element isolation insulating film 102 is formed on the surface side of a semiconductor substrate 100. In this embodiment, the semiconductor substrate 100 is formed of silicon, and the element isolation insulating film 102 is formed of $SiO_2$. The surface of the element isolation insulating film 102 is located at a height equal to or lower than the surface of the semiconductor substrate 100. This MOS transistor is electrically isolated from other elements by this element isolation insulating film 102.

Moreover, source/drain regions 101 are formed apart from each other in the surface side of the semiconductor substrate 100. These source/drain regions 101 are formed by impurity ions being implanted in the semiconductor substrate 100 and annealed.

A gate electrode 106 having an SiN/polysilicon stacked structure is formed on the semiconductor substrate 100 between the source region 101 and the drain region 101 with a gate insulating film 104 therebetween. A silicon oxide film 108 and a silicon nitride film 110 are formed on the surfaces of the semiconductor substrate 100, the element isolation insulating film 102, and the gate electrode 106. The silicon oxide film 108 and the silicon nitride film 110 become a gate sidewall $SiO_2$ and a gate sidewall SiN respectively, and, for example, a total film thickness of the silicon oxide film 108 and the silicon nitride film 110 is 50 nm. In this embodiment, a thickness of the silicon oxide film 108 is 25 nm, and a thickness of the silicon nitride film 110 is also 25 nm.

Figure 5:
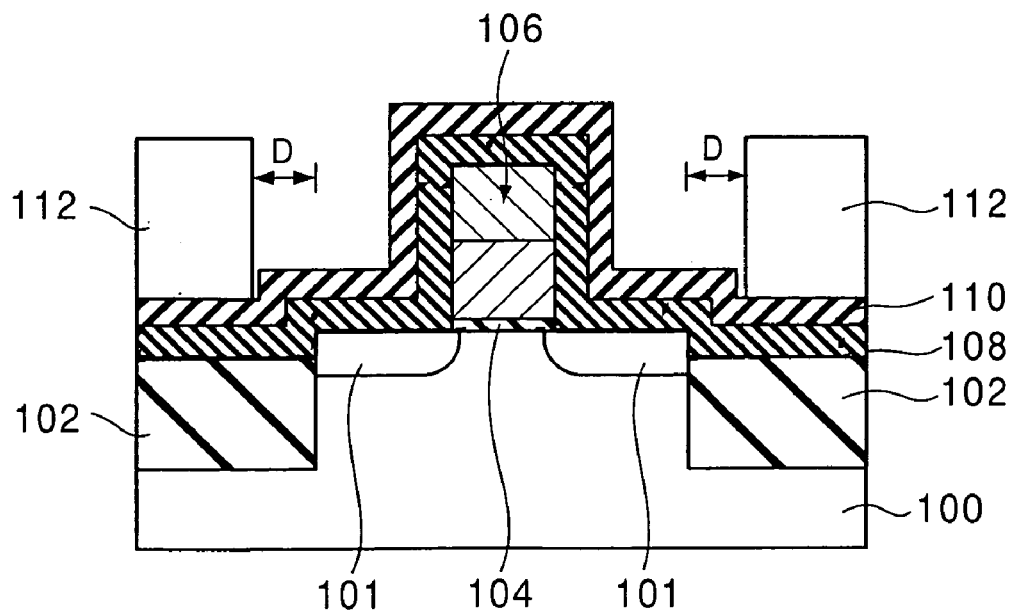
FIG. 5 is a sectional view for explaining the manufacturing process of the semiconductor device composing the MOS transistor according to the first embodiment.

Then, as shown in FIG. 5, a resist pattern 112 is formed on part of the element isolation insulating film 102 by photolithography technology. In this embodiment, the resist pattern 112 is formed in such a manner that a distance between a sidewall of the semiconductor substrate 100 and the resist pattern 112 is D.

Figure 6A:
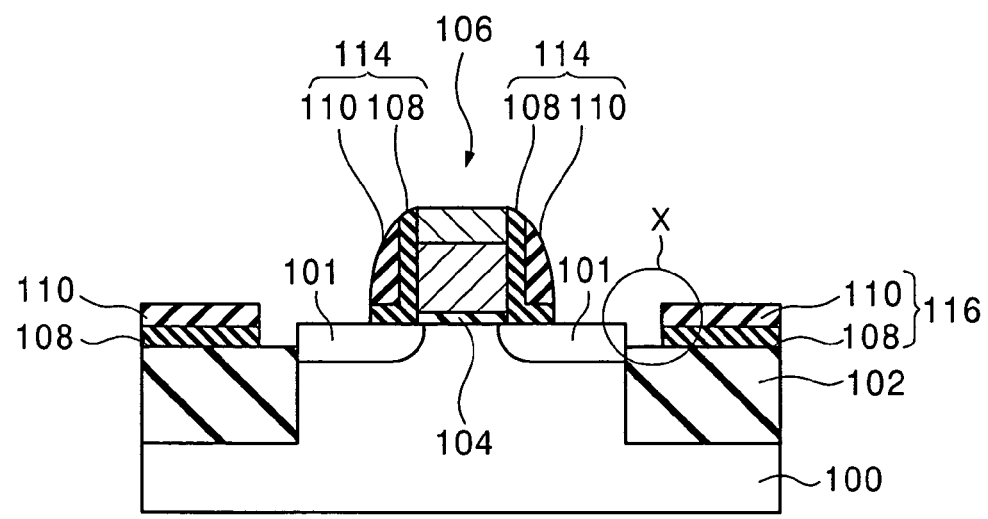
FIG. 6A is a sectional view for explaining the manufacturing process of the semiconductor device composing the MOS transistor according to the first embodiment.

Thereafter, RIE using a plasma of a mixed gas, for example, of HBr, $Cl_2$ gas, and so on is performed on the entire surface. Subsequently, the resist pattern 112 is exfoliated by ashing, and wet cleaning is performed. Thus, the semiconductor device having a structure shown in FIG. 6A is obtained. Namely, a gate sidewall 114 is formed by the silicon oxide film 108 and the silicon nitride film 110 on a sidewall portion of the gate electrode 106, and a stopper 116 is formed by the silicon oxide film 108 and the silicon nitride film 110 on the element isolation insulating film 102. This stopper 116 is located on the surface of the element isolation insulating film 102 and protrudes from the surface of the element isolation insulating film 102.

Figure 6B:
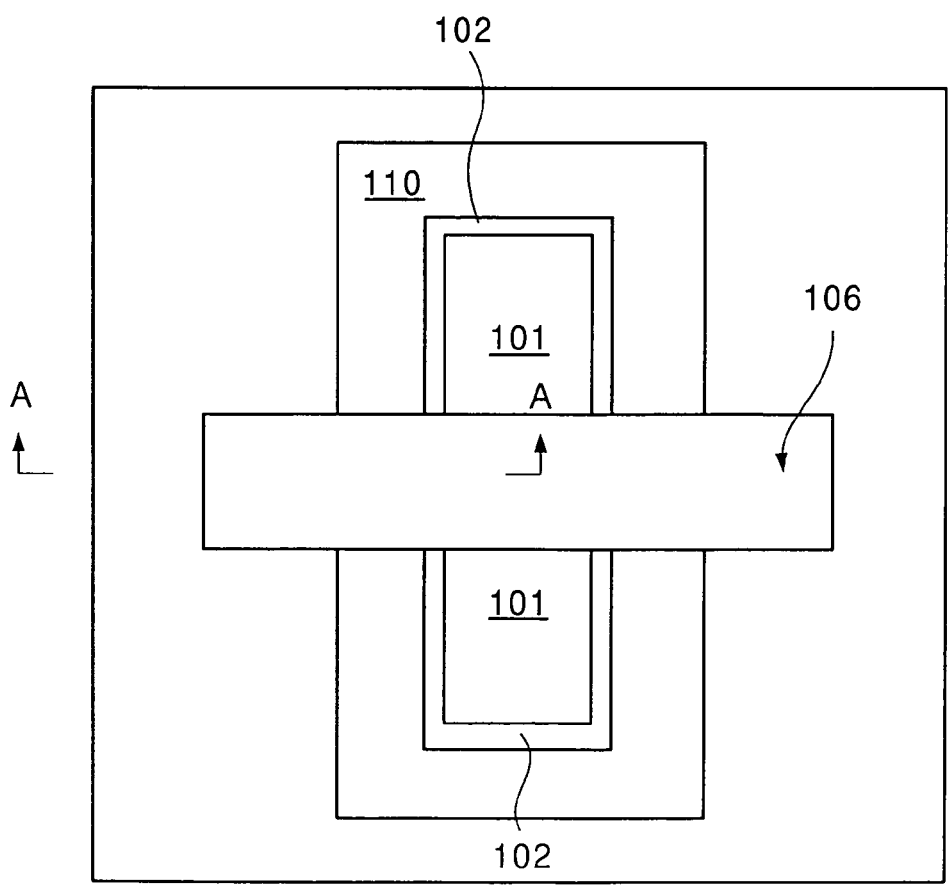
FIG. 6B is a plan view of the MOS transistor in FIG. 6A.
Figure 6C:
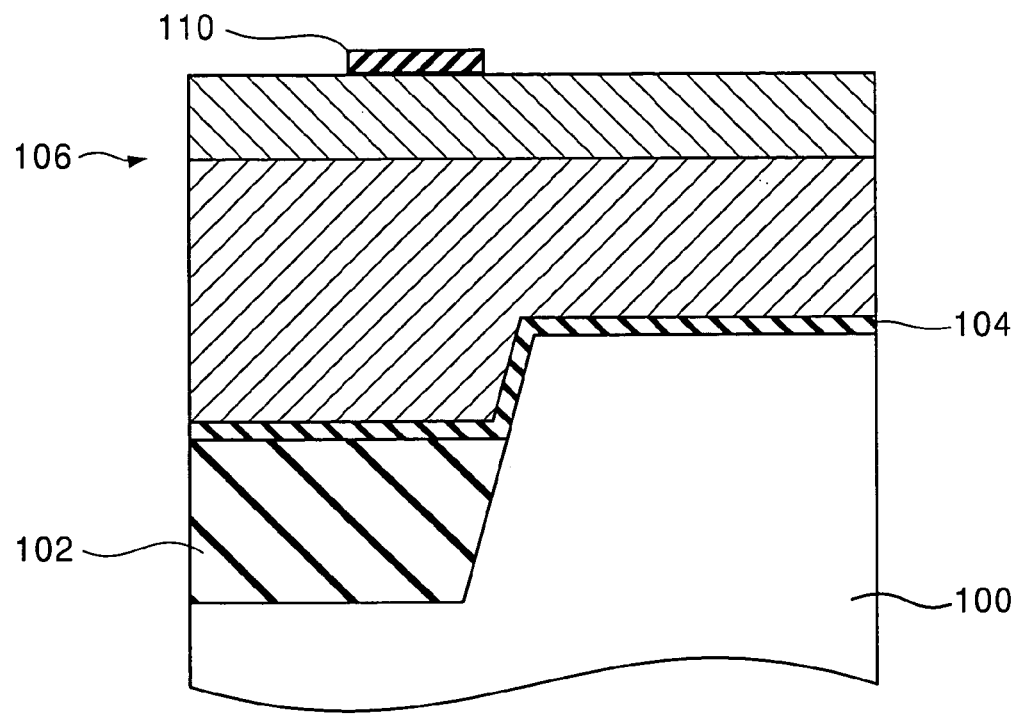
FIG. 6C is a sectional view taken along the line A—A of the MOS transistor in FIG. 6B.

FIG. 6B is a plan view of FIG. 6A, and FIG. 6C is a sectional view taken along the line A—A of FIG. 6B. As be understood from these drawings, the silicon nitride film 110 of the stopper 116 surrounds the element region.

After FIG. 6A, an epitaxial silicon film is formed on the source region 101 and the drain region 101 of the semiconductor substrate 100 by vapor phase selective epitaxial growth.

Figure 7:
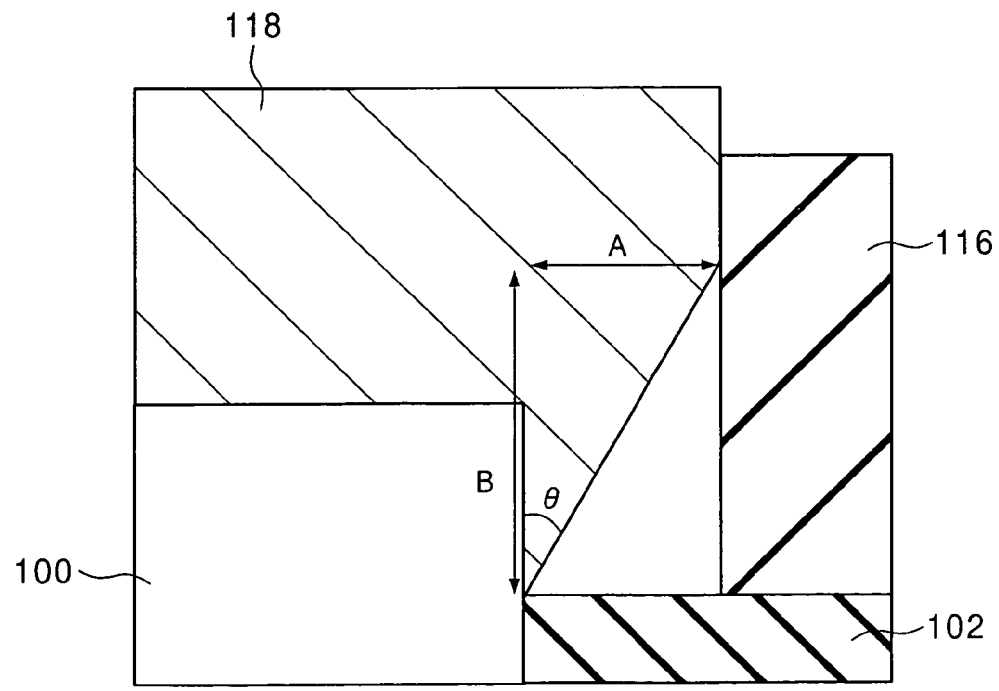
FIG. 7 is an enlarged view of a portion between a sidewall of a semiconductor substrate and a stopper in FIG. 6A.

FIG. 7 is an enlarged view of a step portion (portion X) in the semiconductor device after the epitaxial silicon film is formed. As shown in FIG. 7, an epitaxial silicon film 118, for example, with a film thickness of 50 nm is deposited on the surface of the semiconductor substrate 100, that is, on the source region 101 and the drain region 101 including an exposed sidewall portion of the semiconductor substrate 100. The vapor phase selective epitaxial growth is performed by a low pressure CVD method, for example, at approximately 100 Pa to 1000 Pa, with a mixed gas, for example, of $SiH_2Cl_2$, HCl, $H_2$, and so on. At this time, a facet such as shown in FIG. 7 appears.

For example, if a facet appears with an angle formed by the epitaxial silicon film 118 and the sidewall of the semiconductor substrate 100 being θ when elevated source/drain are formed, then a height B of the stopper 116 needs to satisfy B>A/tan θ, since the distance between the sidewall of the semiconductor substrate 100 and the stopper 116 is A. If this condition is satisfied, when the epitaxial silicon film 118 grows, the epitaxial silicon film 118 grows in a <100> direction (in a direction perpendicular to the semiconductor substrate 100) after a facet face of the epitaxial silicon film 118 touches the stopper 116, which can avoid problems such as a short circuit caused by the formation of the facet. If it is assumed that the sidewall face of the semiconductor substrate 100 is a {110} face and a facet face is a {311} face, for example, θ is 31.4 degrees, and if A is 10 nm, the stopper 116 has the effect of inhibiting the growth of the facet when B is equal to or more than approximately 16.4 nm.

Moreover, the semiconductor substrate 100 and the stopper 116 are apart from each other by the distance A, which can avoid the stopper 116 formed of SiN from becoming charged and the element isolation withstand voltage from deteriorating due to stress.

SECOND EMBODIMENT

Figure 8:
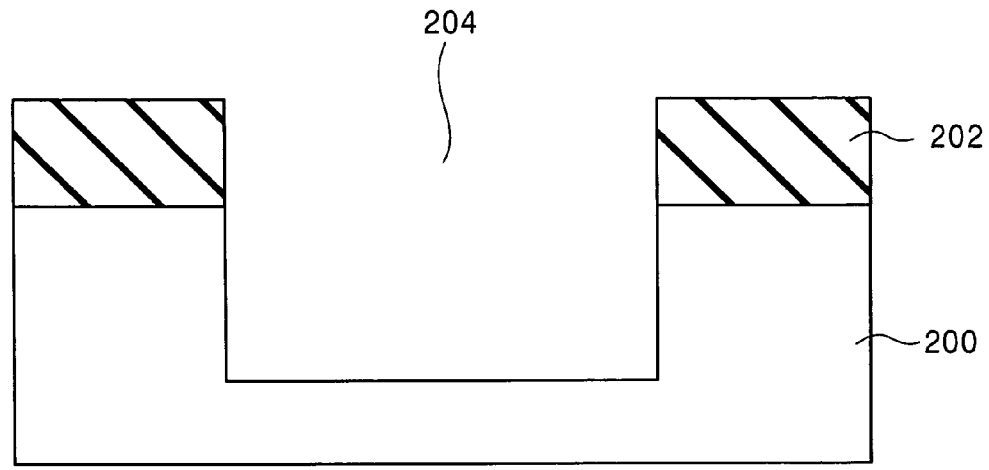
FIG. 8 is a sectional view for explaining a manufacturing process of a semiconductor device composing a MOS transistor according to a second embodiment.

The second embodiment will be described by means of FIG. 8 to FIG. 15. As shown in FIG. 8, a hard mask SiN film 202, for example, with a film thickness of 100 nm is formed on a semiconductor substrate 200. Then, a trench 204 is formed in an STI (Shallow Trench Isolation) region by etching the hard mask SiN film 202 and the semiconductor substrate 200 by the lithography and RIE.

Figure 9:
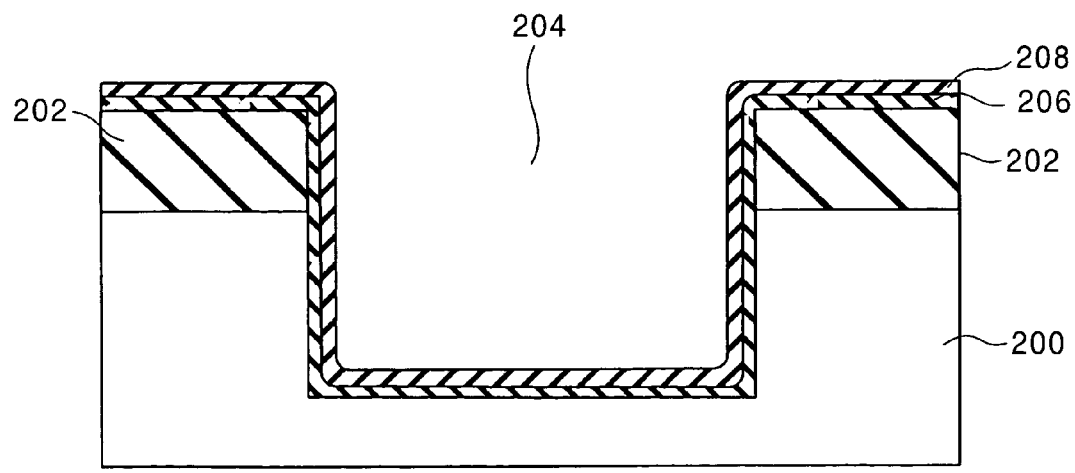
FIG. 9 is a sectional view for explaining the manufacturing process of the semiconductor device composing the MOS transistor according to the second embodiment.

Thereafter, as shown in FIG. 9, a sidewall of the trench 204 and the hard mask SiN film 202 are oxidized by ISSG (In Situ Steam generation) oxidation, for example, at 950° C. to form a silicon oxide film 206. For example, the silicon oxide film 206 is a $SiO_2$ film with a film thickness of 10 nm. Subsequently, a silicon nitride film 208 is formed inside the trench 204 by a low pressure CVD method. For example, the silicon nitride film is an SiN film with a film thickness of 15 nm.

Figure 10:
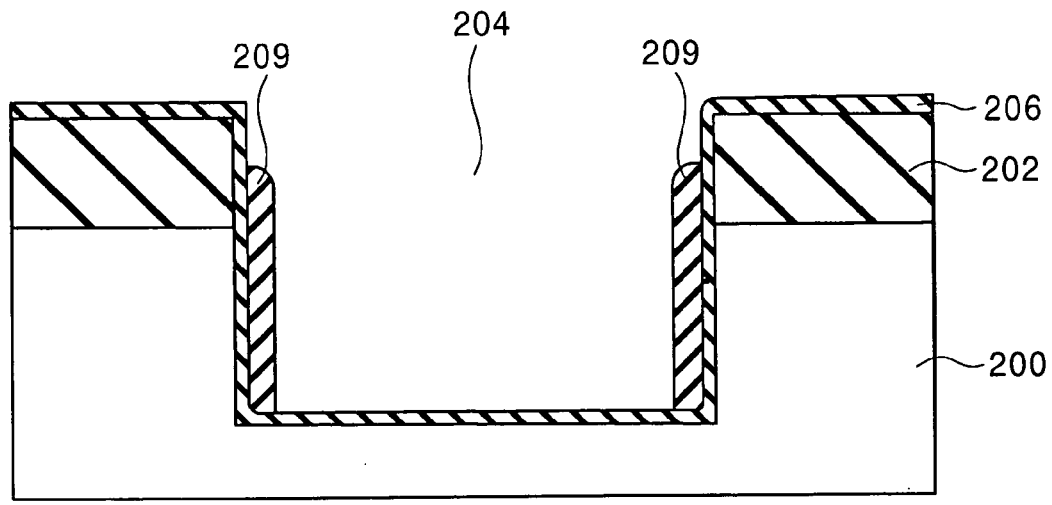
FIG. 10 is a sectional view for explaining the manufacturing process of the semiconductor device composing the MOS transistor according to the second embodiment.

Then, as shown in FIG. 10, the silicon nitride film 208 is etched selectively with respect to the oxide film by RIE which uses a plasma of a mixed gas of $C_5F_8$, $O_2$, and so on, so that the silicon nitride film 208 becomes lower than the surface of the hard mask SiN film 202, for example, by 80 nm. As a result, a stopper 209 is formed by the silicon nitride film 208 remaining on the sidewall of the trench 204.

At this time, the silicon oxide film 206 of ISSG oxidation with a film thickness of approximately 10 nm is located on the surface of the hard mask SiN film 202, so that the hard mask SiN film 202 can be prevented from being damaged. Moreover, although the silicon nitride film 208 at the bottom of the trench 204 is removed, but the semiconductor substrate 200 can be prevented from being damaged by the silicon oxide film 206 under the silicon nitride film 208.

Figure 11:
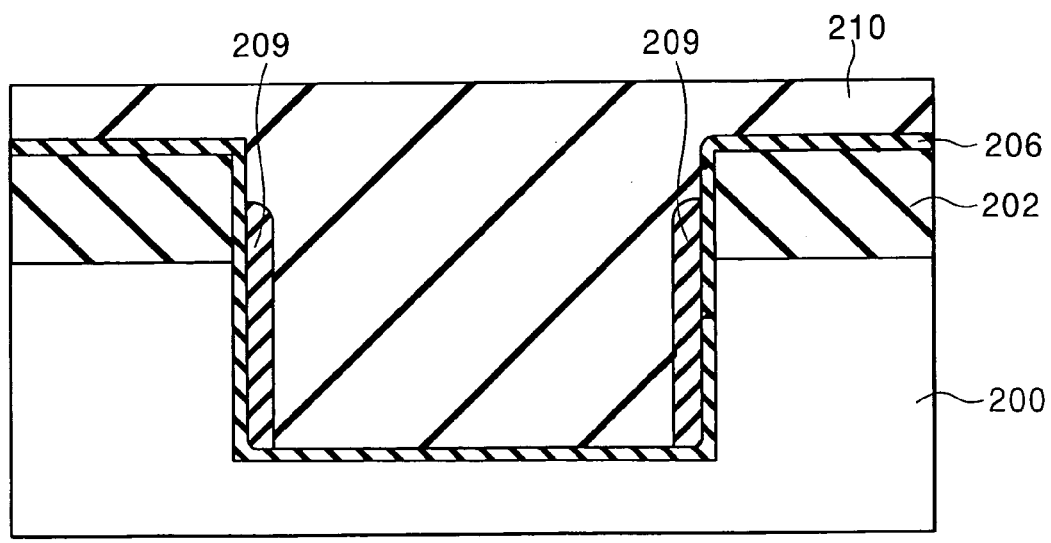
FIG. 11 is a sectional view for explaining the manufacturing process of the semiconductor device composing the MOS transistor according to the second embodiment.

Then, as shown in FIG. 11, embedding in the trench 204 for STI is performed by SOD (Spin on Dielectric) technology, and a buried film 210 is formed by two step annealing, for example, annealing at 400° C. and annealing at 850° C.

Figure 12:
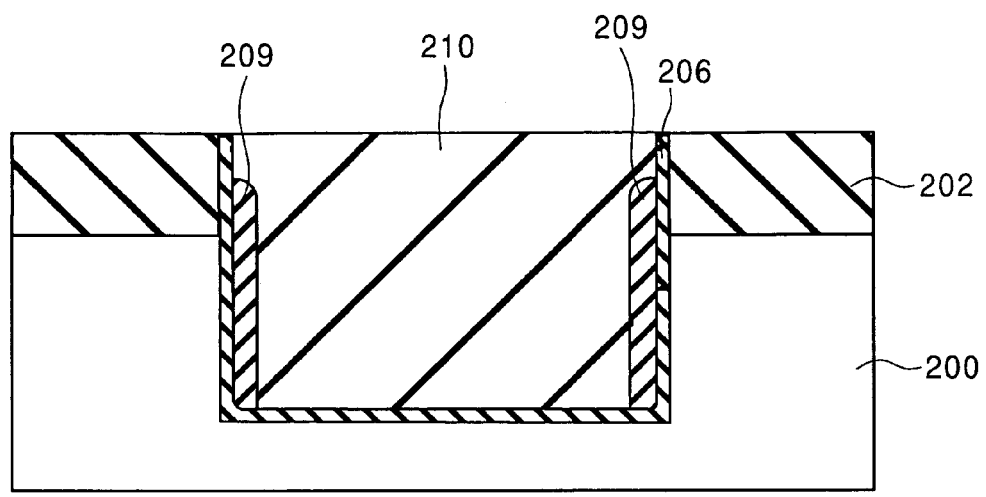
FIG. 12 is a sectional view for explaining the manufacturing process of the semiconductor device composing the MOS transistor according to the second embodiment.

Thereafter, as shown in FIG. 12, the silicon oxide film 206 formed on the buried film 210 and the hard mask SiN film 202 is polished and flattened by CMP technology.

Figure 13:
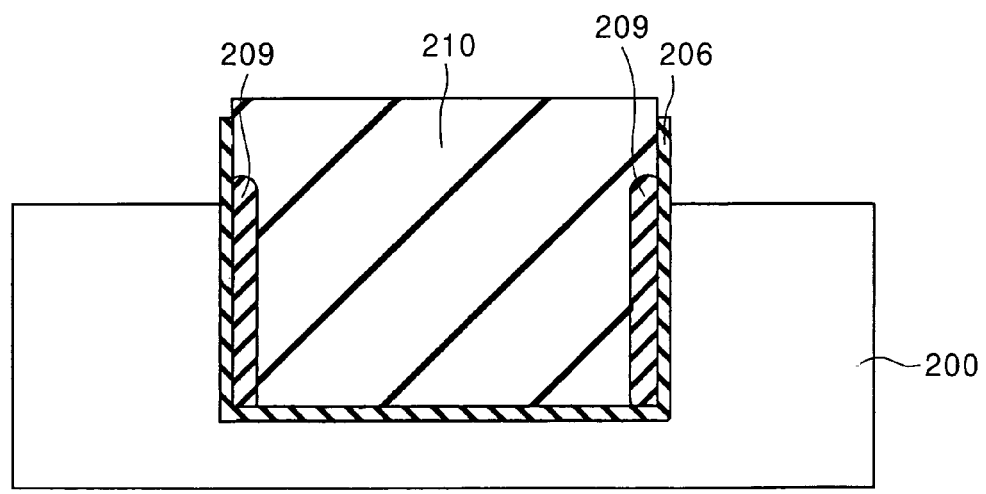
FIG. 13 is a sectional view for explaining the manufacturing process of the semiconductor device composing the MOS transistor according to the second embodiment.
Figure 14:
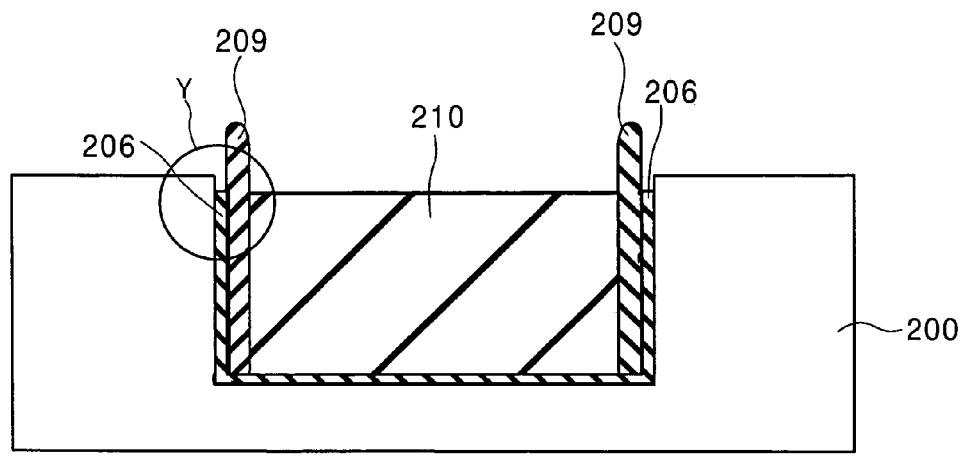
FIG. 14 is a sectional view for explaining the manufacturing process of the semiconductor device composing the MOS transistor according to the second embodiment.

Subsequently, as shown in FIG. 13, the hard mask SiN film 202 is removed, for example, by a thermal phosphoric acid solution. Then, the heights of the buried film 210 and the silicon oxide film 206 are adjusted to a desired height, for example, with a solution having an ammonium fluoride solution as its major constituent, thereby obtaining a semiconductor device such as shown in FIG. 14. As can be seen from FIG. 14, also in this embodiment, the height of the surface of the silicon oxide film 206 is set so as to be equal to or lower than that of the surface of the semiconductor device 200 which forms the source region and the drain region. Moreover, the stopper 209 is embedded between the silicon oxide film 206 and the buried film 210 and protrudes from the surface of the silicon oxide film 206.

Figure 15:
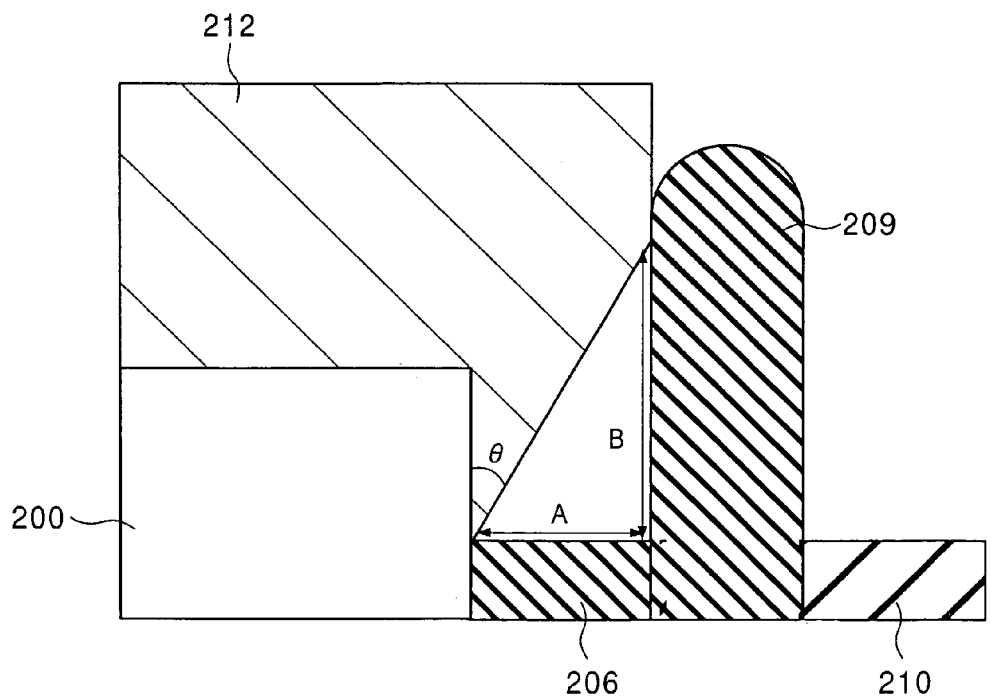
FIG. 15 is an enlarged view of a portion between a sidewall of a semiconductor substrate and a stopper in FIG. 14.

After FIG. 14, an epitaxial silicon film is formed on the source region and the drain region of the semiconductor substrate 200 by vapor phase selective epitaxial growth. FIG. 15 is an enlarged view of a step portion (portion Y) in the semiconductor device after the epitaxial silicon film is formed.

In the example in FIG. 15, an epitaxial silicon film 212, for example, with a film thickness of 50 nm is deposited on the source region and the drain region including a sidewall region of the semiconductor substrate 200 by vapor phase selective epitaxial growth. The vapor phase selective epitaxial growth is performed by a low pressure CVD method, for example, at approximately 100 Pa to 1000 Pa with a mixed gas, for example, of $SiH_2Cl_2$, HCl, $H_2$, and so on. At this time, a facet such as shown in FIG. 15 appears.

If a facet appears with an angle formed by the epitaxial silicon film 212 and the sidewall of the semiconductor substrate 200 being θ when elevated source/drain are formed, for example, and the distance between the sidewall of the semiconductor substrate 200 and the stopper 209 is A, a height B of the stopper 209 needs to satisfy B>A/tan θ. If this condition is satisfied, when the epitaxial silicon film 212 grows, the epitaxial silicon film 212 grows in a <100> direction (in a direction perpendicular to the semiconductor substrate 200) after a facet face of the epitaxial silicon film 212 touches the stopper 209, which can avoid problems such as a short circuit caused by the formation of the facet.

As described above, similarly to the aforementioned first embodiment, this embodiment can also produce the effect of inhibiting the growth of the facet. Moreover, the semiconductor substrate 200 and the stopper 209 are apart from each other by the distance A, which can avoid the stopper 209 formed of SiN from becoming charged and the element isolation withstand voltage from deteriorating due to stress.

Further, the distance A between the sidewall of the semiconductor substrate 200 and the stopper 209 can be controlled by the film thickness of the silicon oxide film 206, whereby the distance A can be set with high precision.

It should be noted that the present invention is not limited to the aforementioned embodiments and can be modified variously. For example, in the aforementioned embodiments, the stoppers 116 and 209 are formed of SiN, but they are only required to be formed of a material having SiN as its major constituent. In other words, the material for the stoppers 116 and 209 are only required to be a material which enables the epitaxial silicon films 118 and 212 to grow in a vertical direction after the facets of the epitaxial silicon films 118 and 212 have grown and touch the stoppers 116 and 209.

Further, the element isolation insulating film 102 in the aforementioned first embodiment is formed of $SiO_2$, but it is only required to be formed of a material having $SiO_2$ as its major constituent. This point applies to the silicon oxide film 206 in the second embodiment as well.

Furthermore, the epitaxial growth in the present invention includes incomplete epitaxial growth and partial epitaxial growth. Besides, the material for the elevated source/drain to be epitaxially grown is not limited to silicon.

What is claimed is:

1. A semiconductor device, comprising:
   a semiconductor substrate;
   a source region which is formed in a surface side of the semiconductor substrate;
   a drain region which is formed in the surface side of the semiconductor substrate which is apart from the source region;
   a gate electrode which is formed over the semiconductor substrate via a gate insulating film and which is substantially between the source region and the drain region;
   an element isolation insulator which is formed on the surface side of the semiconductor substrate to provide electrical insulation from other elements, a height of a surface of the element isolation insulator being equal to or lower than that of the surface side of the semiconductor substrate;
   a stopper which is formed of a material different from that of the element isolation insulator and which is formed on the element isolation insulator so as to protrude from the surface of the element isolation insulator, the stopper being at a distance from a boundary between the source region/drain region and the element isolation insulator; and
   an elevated source/drain which is formed on the source region and the drain region so as to be elevated from the surface side of the semiconductor substrate, wherein a condition of $B > A/\tan\theta$ is satisfied, where $\theta$ is an angle which is formed by a face that a boundary face of the boundary is extended in a height direction and a facet of the elevated source/drain between the source region/drain region and the stopper. A is the distance from the boundary to the stopper, and B is a height by which the stopper protrudes from the surface of the element isolation insulator.

2. The semiconductor device according to claim 1, wherein the element isolation insulator is formed of a material including $SiO_2$ as a major constituent of the element isolation insulator.

3. The semiconductor device according to claim 2, wherein the stopper is formed of a material including SiN as a major constituent of the stopper.

4. The semiconductor device according to claim 1, wherein a facet appears in the elevated source/drain, and the elevated source/drain grows in a vertical direction after the elevated source/drain touches the stopper.

5. The semiconductor device according to claim 1, wherein the stopper is formed on the element isolation insulator.

6. The semiconductor device according to claim 1, wherein the elevated source/drain is formed by epitaxially growing silicon.

7. A semiconductor device, comprising:
   a semiconductor substrate;
   a source region which is formed in a surface side of the semiconductor substrate;
   a drain region which is formed in the surface side of the semiconductor substrate which is apart from the source region;
   a gate electrode which is formed over the semiconductor substrate via a gate insulating film and which is substantially between the source region and the drain region;
   an element isolation insulator which is formed on the surface side of the semiconductor substrate to provide electrical insulation from other elements, a height of a surface of the element isolation insulator being equal to or lower than that of the surface side of the semiconductor substrate;
   a stopper which is formed of a material different from that of the element isolation insulator and which is formed on the element isolation insulator so as to protrude from the surface of the element isolation insulator, the stopper being at a distance from a boundary between the source region/drain region and the element isolation insulator; and
   an elevated source/drain which is formed on the source region and the drain region so as to be elevated from the surface side of the semiconductor substrate, wherein the element isolation insulator comprises:
   a first insulating film which is formed inside a trench which is formed in the semiconductor substrate to form an element isolation region; and
   a second insulating film which is formed inside the first insulating film, and wherein the stopper is embedded between the first insulating film and the second insulating film and formed so as to protrude from a surface of the first insulating film.

8. The semiconductor device according to claim 7, wherein the element isolation insulator is formed of a material including $SiO_2$ as a major constituent of the element isolation insulator.

9. The semiconductor device according to claim 8, wherein the stopper is formed of a material including SiN as a major constituent of the stopper.

10. The semiconductor device according to claim 7, wherein a facet appears in the elevated source/drain, and the elevated source/drain grows in a vertical direction after the elevated source/drain touches the stopper.

11. The semiconductor device according to claim 7, wherein the stopper is formed on the element isolation insulator.

12. The semiconductor device according to claim 7, wherein the elevated source/drain is formed by epitaxially growing silicon.

* * * * *